United States Patent
Karlsson et al.

(10) Patent No.: US 7,345,906 B2
(45) Date of Patent: Mar. 18, 2008

(54) READ METHOD AND SENSING DEVICE

(75) Inventors: Christer Karlsson, Linköping (SE); Niklas Lövgren, Linköping (SE); Richard Womack, Albuquerque, NM (US)

(73) Assignee: Thin Film Electronics ASA, Oslo (NO)

( * ) Notice: Subject to any disclaimer, the term of this patent is extended or adjusted under 35 U.S.C. 154(b) by 238 days.

(21) Appl. No.: 11/231,895

(22) Filed: Sep. 22, 2005

(65) Prior Publication Data

US 2006/0062042 A1    Mar. 23, 2006

(30) Foreign Application Priority Data

Sep. 23, 2004   (NO)   .................... 20043977

(51) Int. Cl.
  *G11C 11/22*   (2006.01)
(52) U.S. Cl. ........................ 365/145; 365/149
(58) Field of Classification Search ................ 365/145, 365/149, 205, 207
  See application file for complete search history.

(56) References Cited

U.S. PATENT DOCUMENTS

| | | | |
|---|---|---|---|
| 6,522,568 B1 * | 2/2003 | Nair ........................... | 365/145 |
| 6,611,448 B2 * | 8/2003 | Nair et al. .................. | 365/145 |
| 6,788,563 B2 * | 9/2004 | Thompson et al. ......... | 365/145 |
| 2003/0103386 A1 | 6/2003 | Broms et al | |
| 2003/0117830 A1 | 6/2003 | Chow | |
| 2003/0137865 A1 | 7/2003 | Thompson et al. | |
| 2003/0227809 A1 | 12/2003 | Schwartz | |
| 2005/0254282 A1 * | 11/2005 | Summerfelt et al. ........ | 365/145 |

FOREIGN PATENT DOCUMENTS

| | | |
|---|---|---|
| EP | 0712135 A2 | 5/1996 |
| WO | WO-02/05287 A1 | 1/2002 |
| WO | WO-02/05288 A1 | 1/2002 |
| WO | WO-02/17322 A2 | 2/2002 |
| WO | WO-02/069340 A1 | 9/2002 |
| WO | WO-03/046923 A1 | 6/2003 |
| WO | WO-2004/017327 A2 | 2/2004 |
| WO | WO-2004/086406 A1 | 10/2004 |

* cited by examiner

*Primary Examiner*—Anh Phung
(74) *Attorney, Agent, or Firm*—Birch, Stewart, Kolasch & Birch, LLP

(57) ABSTRACT

In a method for reading the memory cell in a passive matrix-addressable ferroelectric or electret memory array with memory cells in the form of ferroelectric or electret capacitors, sensing means connected to the bit line of memory cell is activated in order to initiate a charge measurement and a first charge value is registered, whereafter a switching voltage is applied to the memory cell and a second charge value is registered. A readout value is obtained by subtracting the first charge value from the second charge value. A sensing device for performing an embodiment of the method comprises a first amplifier stage with an integrator circuit and connected with a second amplifier stage (A2) following the first amplifier stage and with an integrator circuit, and a sampling capacitor connected between an output of the first amplifier stage and an input of the second amplifier stage.

12 Claims, 7 Drawing Sheets

READ METHOD AND SENSING DEVICE

FIELD OF THE INVENTION

The present invention concerns methods for reading a memory cell in a passive matrix-addressable ferroelectric or electret memory array with memory cells in the form of electret or ferroelectric capacitors, wherein the memory cells are located at the crossings of a first and second set of respective parallel electrodes, the first set forming word lines and the second set forming bit lines, wherein the word lines and the bit lines are connected to driving means, wherein the bit lines have connection to sensing means for measuring charge flowing in the bit lines, wherein the sensing means in a read operation senses a charge response signal or charge response corresponding to the data, typically a binary one or a binary zero, and wherein the method is performed in contiguous successive time intervals.

The present invention also concerns a sensing device for performing an embodiment of the method according to the present invention, wherein the sensing device used for reading data stored in a passive matrix memory comprising memory cells in the form of electret or ferroelectric capacitors, wherein the memory cells are located at the crossings of a first and second set of respective parallel electrodes, the first set forming word lines (WL) and the second set forming bit lines (BL), wherein the word lines and the bit lines are connected to driving means, wherein the bit lines have connection to sensing means for measuring charge flowing in the bit lines, wherein the sensing device senses a charge response corresponding to the data, typically a binary one or a binary zero, and wherein the sensing device comprises a first amplifier stage (A1) with an integrator circuit consisting of a first amplifier with a first gain and a first bandwidth.

DESCRIPTION OF THE RELATED PRIOR ART

During recent years, non-volatile data storage devices have been demonstrated where each bit of information is stored as a polarization state in a localized volume element of an electrically polarizable material. A material of this kind is called an electret or ferroelectric material. Formally ferroelectric materials are a subclass of electret materials and capable of being spontaneously polarized to either a positive or negative permanent polarization state. By applying an electric field of appropriate polarity, it is moreover possible to induce a switching between the polarization states. Non-volatility is achieved since the material can retain its polarization even in the absence of externally imposed electrical fields. One of the polarization states is considered to be a logic "1" and the other a logic "0". This is utilized in memory cells where the ferroelectric or electret material, i.e. the memory material, is located with connection to at least two separate electrodes that can apply voltages over the memory material.

The memory cells are typically arranged in arrays where a memory cell is defined in a portion of memory material located at the crossing of two separate electrodes, one referred to as bit line and the other as word line. Multiple bit lines and word lines that cross each other, results in a memory array or memory matrix with several memory cells along each bit line and word line. Memory matrices of this kind are either of active or passive type. In an active matrix there are active elements, for example transistors linked to individual memory cells, while there are no such elements in a passive matrix arranged memory device. A passive matrix leads to simplicity in manufacturing and allows for high integration density but to the cost of different types of disturbances related to that cells are not electrically isolated from each other and share common electrodes. In the following focus is directed towards passive matrix memories.

In a passive matrix memory device there are typically voltage drivers connected to both bit line and word lines to be able to set and control voltages over memory cells. Sensing means are used in reading for detecting and registering released charge, typically in the form of sense amplifiers connected to the bit lines, i.e. it is the bit line current that is sensed when a memory cell are read. Electrode voltages are defined and presented in timing diagrams, also known as pulse protocols, which presents electric potentials on electrodes and how these change over time, e.g. during write and read.

Due to the relatively small signal current released from a memory cell in reading, a major concern in the past has been to decrease influence of masking currents, also known as sneak currents, and improving the signal strength and quality in order to be able to better determine which logic state that is represented by a readout value.

There are several remedies proposed for sneak currents of which many can be used in combination. One way of reducing sneak currents during read is by applying a so called "full row read" pulse protocol where all cells along a word line simultaneously receive switching voltages and hence are read in parallel. This makes it possible to accomplish zero or fractional voltages difference over cells that are not read, i.e. over non-addressed cells. Non-addressed cells will in this case refer to cells in other word lines since there are no non-addressed bit lines during full row read. A pulse protocol for full row read is disclosed in the present applicants International published patent application No. WO03/046923.

The sneak problem is also addressed by different methods of arranging and operating a sensing device in connection with timing diagram to provide a reliable readout signal. One known method is "dual read", which for example is disclosed together with suitable sensing devices in the present applicants Norwegian patent No. Signal to noise ratio may be further be improved by using efficient charge references and adapted sense amplifiers in a sensing device, for example as disclosed with regard to using pseudo-differential sense amplifiers in the present applicants International patent application 2004/086406.

To summarize, there are various ways of reducing noise in readout values from passive matrix memories of the relevant type, some of them referenced above. Focus in prior proposals has primarily been on reducing influence of sneak currents and for use in systems where sneak currents are a dominating noise factor during read. However, when sneak currents are eliminated as a main noise contributor, other sources of noise will have to be considered and dealt with accordingly, especially when it is still of importance to further improve the signal-to-noise ratio in readout values from passive memory devices.

These other noise sources include significant noise sources that are not abated by, say the application of voltage pulse protocols in order to reduce the effect of sneak currents and stray capacitances mainly due to parasitic couplings in a passive matrix-addressable ferroelectric memories, particularly as their size are increased to encompass million of memory cells in the array and the parallel accessing of several thousands of the said cells. An equally challenging task is to reduce or eliminate noise generated in the sensing and sampling means, i.e. the sense amplifier used to integrate and amplify detected current or charge flowing in the bit line connecting the addressed memory cell and the sense amplifier. Such noise includes sampling noise, that is thermal noise generated by sense amplifier and associated circuitry, and offset noise, that is voltage deviations introduced in the sampling step. To a little extent the noise generated by the sensing and sampling circuitry has been recognized in the prior art. Nevertheless such noise may significantly affect the bit error rate in the readout from ferroelectric or electret memories.

SUMMARY OF THE INVENTION

It is thus a major object of the invention to improve signal-to-noise ratio in readout values from passive matrix-addressable ferroelectric or electret memories. More specifically, it is a major object to reduce the sampling noise and voltage noise (offset noise) of the sensing device. Finally there is an object to provide a sensing device which is able to reduce or eliminate any noise specifically occurring in sensing and sampling operations.

The above-mentioned objects as well as other features and advantages are realized with a method according to the present invention and characterized by claim 1, and with a device according to the present invention and characterized by claim 4.

BRIEF DESCRIPTION OF THE DRAWINGS

The invention will now be explained in further detail in conjunction with the appended drawing figures, wherein.

DETAILED DESCRIPTION

Before the present invention is explained with reference to preferred embodiments, a brief review of its general background shall be given with particular reference to the hysteresis of ferroelectric and electret materials and the structure of relevant passive matrix addressable memory devices.

Figure 1:
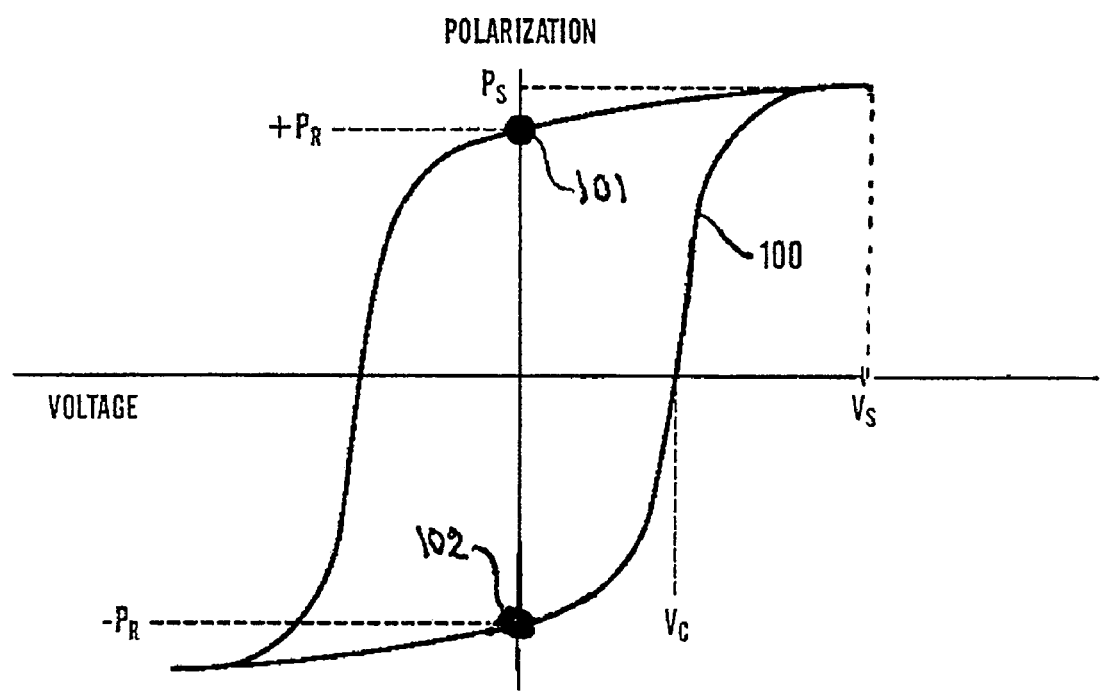
FIG. 1 shows a schematic hysteresis curve of relevant memory materials, FIG. 2a a principle drawing of word line and bit line electrodes arranged in a matrix, FIG. 2b a principle drawing of memory cells in the form of ferroelectric or electret capacitors located at the crossings of word line and bit line electrodes, FIG. 3 a principle block diagram of structure and functional elements in a typical passive matrix-addressable memory device, FIG. 4 a circuit diagram of a sensing device as known from prior art, FIG. 5 a graph providing an example of signal behaviour when sensing devices from prior art are operated according to known methods, FIG. 6 a flow chart of a preferred embodiment of a method according to the invention, FIG. 7 a circuit diagram of a preferred embodiment of a sensing device according to the invention, FIG. 8 a circuit diagram of another preferred embodiment of a sensing device according to the invention, and FIG. 9 a graph rendering an example of signal behaviour with improved signal to noise ratio when a sensing device is operated according to the present invention.

Referring to FIG. 1, a material with a hysteresis curve 100, typically a ferroelectric or electret material, changes its polarization direction upon application of an electric field that exceeds the coercive field. The hysteresis curve is shown with the voltage rather than the field along the abscissa axis for reasons of convenience. The coercive voltage $V_C$ is calculated by multiplying the coercive field strength $E_C$ with the thickness of the material layer. A saturation polarization $P_S$ occurs whenever a cross-point, i.e. a memory cell, is subject to the nominal switching voltage $V_S$. Once the electric field is removed the polarization will return to one of two remanent polarization states $P_R$ 101 and $-P_R$ 102. One of the remanent polarization states typically represents a stored logic '0' while the other represents a stored logic "1", hence a non-volatile memory function is provided.

Figure 2A:
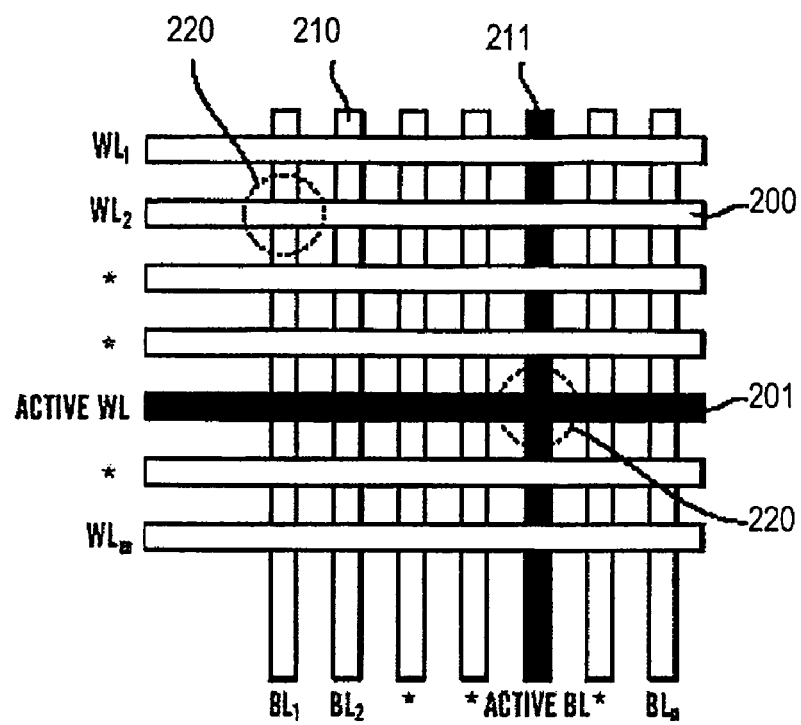
Figure 2B:
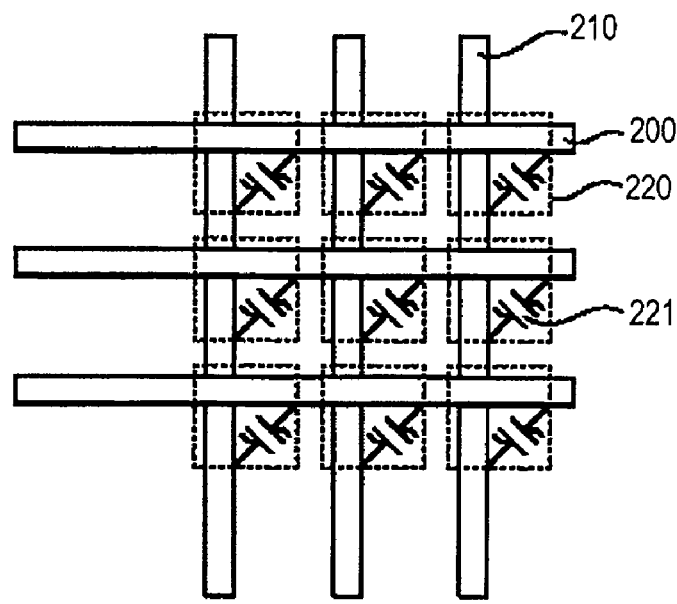

FIG. 2a shows a matrix of orthogonally intersecting electrodes lines. In order to conform to standard terminology, it is henceforth referred to the horizontal (row) electrode lines as word lines 200, abbreviated WL and to vertical (column) electrode lines as bit lines 210, abbreviated BL. Memory material of relevant type provided at the intersections of word lines and bit lines, typically provided as a thin film layer of ferroelectric or electret material between two layers of bit line and word line electrodes. During drive and sense operations selected word lines 201 and bit lines 211 are activated and set to a predetermined set of potentials such that the difference equals the nominal switching voltage $V_S$. A memory cell being addressed by an operation is located at the intersection of an active bit line and an active word line. A voltage that is sufficiently high to switch an addressed cell is required, either for defining a given polarization direction in that cell (writing), or for monitoring the preset polarization direction (reading). At the same time, the numerous word lines 200 and bit lines 210 that cross at cells 220 that are not addressed for the time being must be controlled in potential such that the disturbing voltages at these cells 220 are kept to a minimum. The ferroelectric material layer located between the electrodes functions like a ferroelectric capacitor 221 as shown in FIG. 2b. In reading, a nominal switching voltage of known polarity is applied to an addressed cell. This results in a polarization switch, or "flip", of the memory cell in question depending on which logic value, i.e. polarization state, that previously was stored/set in the cell. A polarization switch results in release of more charges than a non-switch which is used for detection where charges that flow in the bit line intersecting the addressed cell are sensed and measured.

An arrangement of memory cells as described above is typically refereed to a passive matrix. "Passive" refers to the fact that no active elements are linked to the memory cells in the matrix. A passive structure of the above type leads to simplicity of manufacture and high density of cross points, i.e. memory cells. A problem in general for memory cells of ferroelectric or electret material is the relatively small current that is released from switching a memory cell. This makes the signals sensitive to noise. For example, charge released from a memory cell having an area of 0.0625 μm² is typically of the order 20 fC. The relatively small signal current is particularly a problem for passive matrix arranged memory cells due to influence from non-addressed memory cells. An addressed memory cell may for example share bit line and word line with thousands of other memory cells that causes disturbances and noise. Unaddressed memory cells receive fractional voltages and so called "disturb voltages" during operation, which in turn cause so called "sneak currents", i.e. undesired and lingering currents that sum up on a bit line and may mask the current response from the addressed cell.

It may be useful to review the overall function and structure of a typical passive matrix-addressable memory device in a generalized manner.

Figure 3:
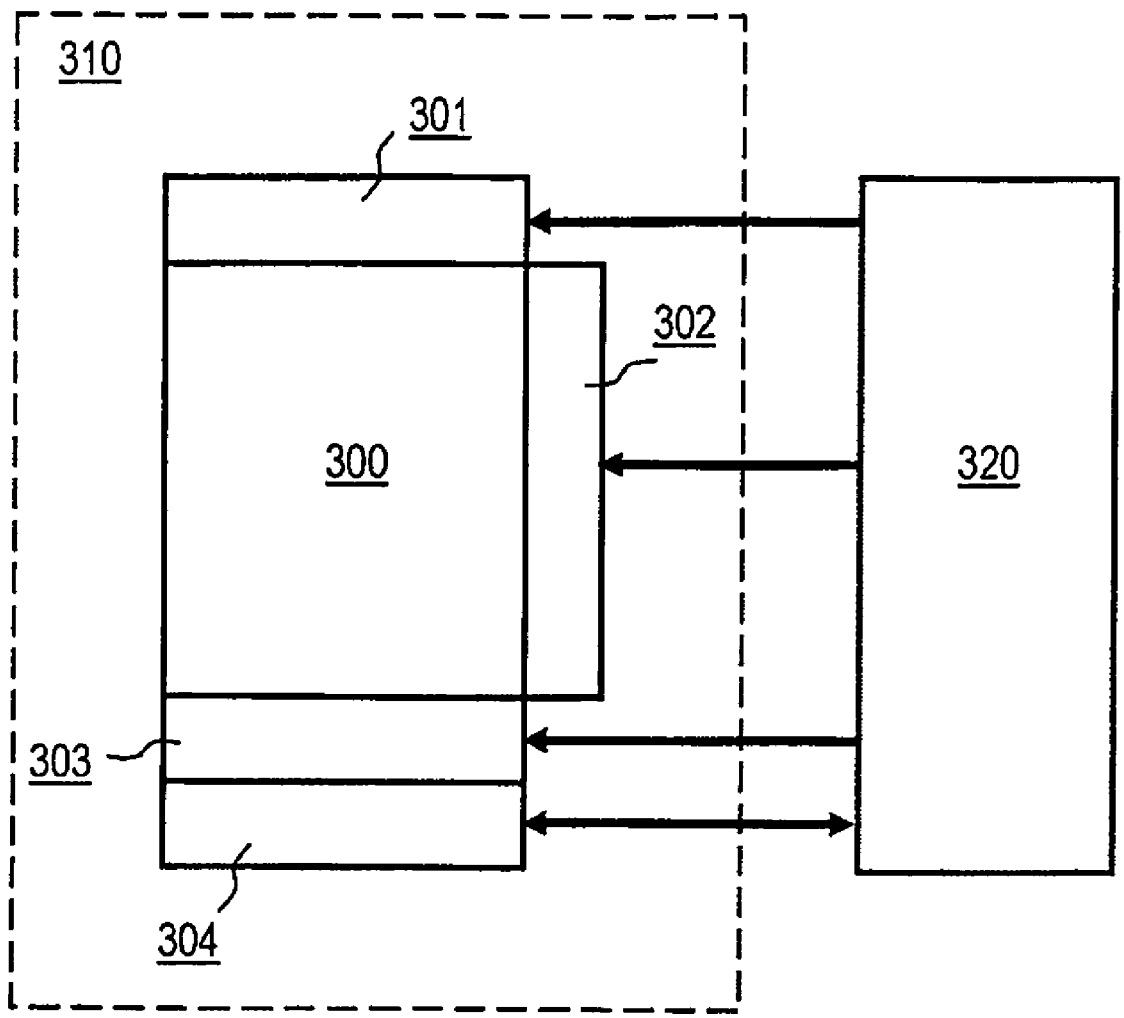

FIG. 3 shows in a simplified block diagram form the structure and functional elements of a typical passive matrix-addressable memory device relevant for the present invention. A memory macro 310 consists of a memory array 300, row (word line) and column (bit line) decoders 302; 301, sensing means 303 and data latches 304. The memory array 300 contains the matrix of word lines 200 and bit lines 210. The row and column decoders 302; 301 decode the addresses of memory cells while sensing is performed by the sensing means 303. The data latches 304 hold the data until part or all of the data is transferred to a memory control logic 320. The memory control logic may control several memory macros 310. The memory control logic 320 module provides a digital interface for the memory macro 310 and controls the reads and writes of the memory array 300.

One of the dominating read methods for use with passive matrix-addressable memories of the relevant type have so far mainly been based on a so-called dual read principle. Dual read on a memory cell in a bit line in the matrix can briefly be described as in the following. Bit lines and word lines receive so-called pre-charge voltage levels without cell switching capability. Sensing of charges starts, then voltage levels are shifted from a pre-charge state to a read state such that a read voltage with switching capability is applied over the memory cell to be read. A first read value is registered, typically sampled. After this the voltage levels typically are returned to the pre-charge state and the sensing means are reset and then the procedure is repeated resulting in a second read value. Since the first read guarantees that the addressed memory cell already is switched in the direction given by the polarity of the predetermined read voltage, the second read value will never include charges released from a polarization switch. Subtracting the second value from the first value forms the readout value, which then is used to determine logic state of the read cell. The intention is of course that undesired contributions in the signal e.g. sneak currents that are the same during the two reads shall be cancelled out in the subtraction, leaving a readout value representing only the charge released from the read cell. However, in practice there will always be some degree of uncertainty connected to the readout value, e.g. there may be a contribution of sneak currents in both read values, which not entirely will cancel out, or there may be a non-linear presence of lingering sneak currents from prior operations. Moreover, the amount of released charges will typically be dependent on the addressing history of the memory and it is therefore often required to use some sort of variable reference threshold level in determination of which logic value that is represented by a readout value.

Figure 4:
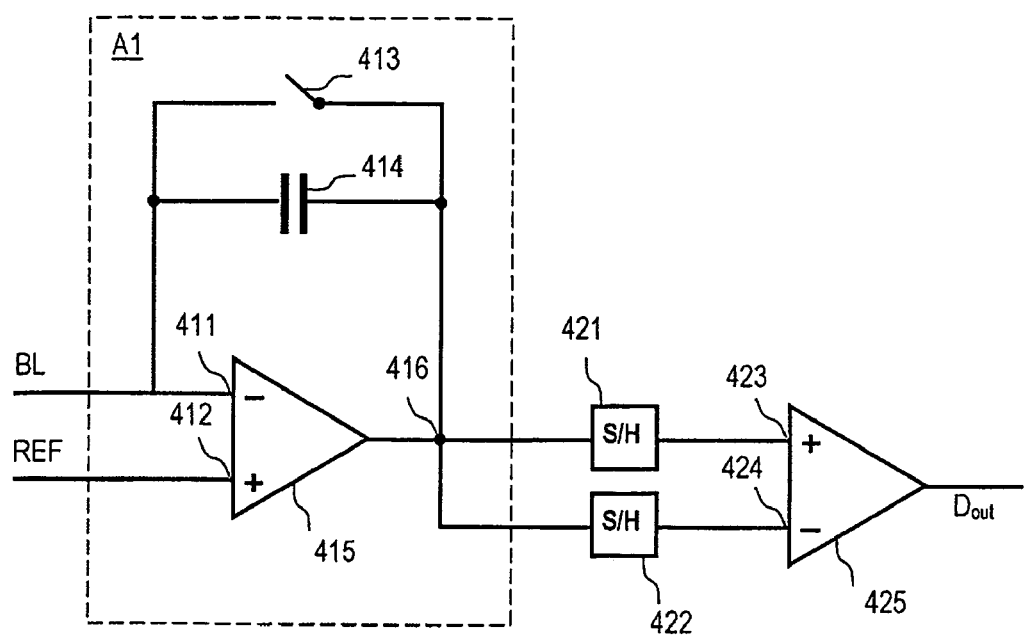

FIG. 4 shows principal functional components of a sensing means that can be used for implementing dual read. The means or the read device in FIG. 4 constitutes an amplifier stage A1 which is an integrator circuit, consisting of an amplifier 415, preferably a sense amplifier, with a feedback capacitor 414 between the inverting input 411 and the output 416. The feedback capacitor 414 has a switch 413 in parallel used for switching the amplifier between integrator mode and voltage follower mode. A bit line BL is connected to the inverting input 411 of the amplifier and a predetermined reference voltage REF is applied to the non-inverting input 412. A first and second read value from the integrator is stored in first and second sample and hold circuits 421; 422 respectively. The read value stored in the sample and hold circuit 421 is fed to a non-inverting input 423 of a comparator circuit 425, while the read value stored in the sample and hold circuit 422 is fed to the inverting input 424 of the comparator. The comparator compares the two read values and generates a data output signal $D_{out}$ representing the readout value. The $D_{out}$ value is then used to produce a logic value, which typically is made available to the rest of the memory device, e.g. a memory controller, via a latch.

It shall be noted that the device in FIG. 4 may implement other methods besides dual read, and that dual read also may be implemented by other devices than the one illustrated in the figure. However, most known read devices of relevant type take advantage of an integrator circuit, typically a sense amplifier in integrator mode. The integrator is typically activated/inactivated using a switch that in closed state bypasses the feedback capacitor and turn the amplifier into a voltage follower.

Figure 5:
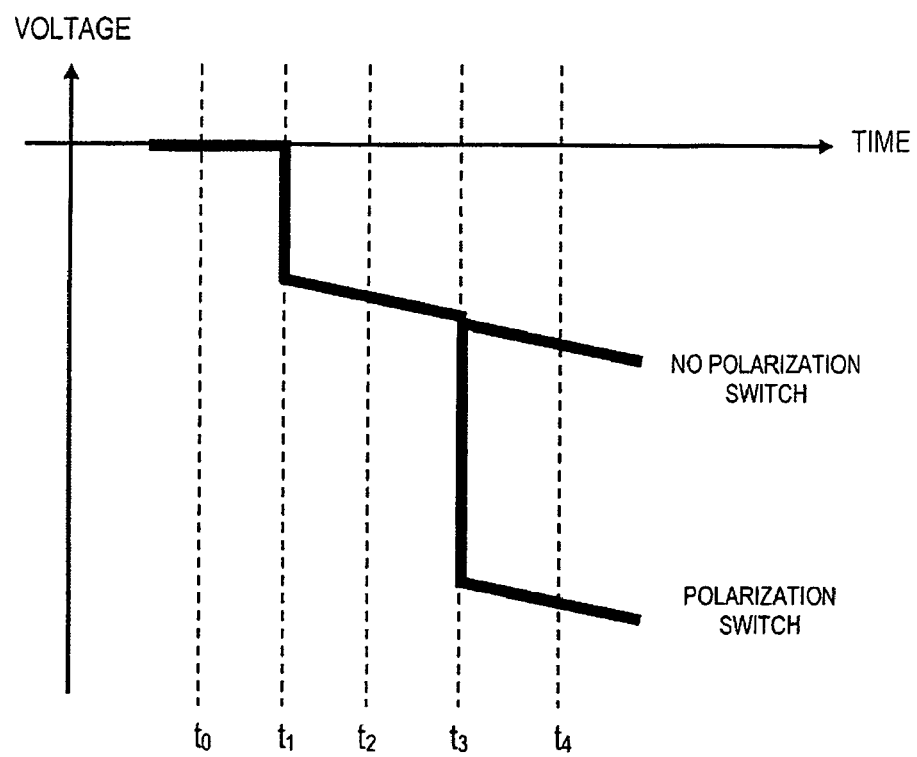

FIG. 5 now illustrates typical signal behaviour on the integrator/sense amplifier output during the first part of a typical read of a memory cell in a passive matrix of the relevant type. The output corresponds to node 416 of the device in FIG. 4. In the case of dual read, the signal behaviour in FIG. 5 only shows the situation until the point of time when the first read value shall be registered. The signal level has been normalized so that the output starts on zero voltage and then will increase with negative numbers due to the negative feedback. Before time $t_1$, for example at $t_0$, the voltage levels applied to the electrodes results in pre-charge voltages over the memory cells and there is no cell voltage with switching capability. In pre-charge, cell voltages over cells that are not to be read typically are the same as during the later application of read cell voltages. At time $t_1$, the charge measurement starts. Using the device shown in FIG. 4 this implies that the switch 413 is opened and that integration starts. Due to the nature and small size of the signal to detect, the amplifier 415 needs to provide a relatively high amplification and high bandwidth. A side effect from this is that noise on the input of the amplifier 415 will be amplified as well, resulting in a signal-to-noise degradation shown as a sudden variation of unpredictable magnitude in the signal behaviour at point $t_1$ in FIG. 5. What typically happens is that that thermal noise from the switch 413 together with offsets and thermal noise from the amplifier 415 is sampled by capacitance in the bit line and then amplified (also known as kT/C noise). Due to the unpredictable magnitude, the noise originating from this cannot be compensated for by the traditional dual read approach. However, in prior situations employing dual read, the main issue has been noise originating from sneak currents and in these situations the described contribution of offset and thermal noise has been considered minor and negligible. The slope of the signal between $t_1$ and $t_3$ (and later after $t_3$) represents possible leakage due to practical limitations. At time $t_3$, read level signals are applied, i.e. the cell to be read receives a voltage with switching capability. This may be achieved by "activating" a word line, meaning that a word line potential is raised so that all cells in a specific word line simultaneously receive switching voltages, i.e. all cells in this particular word-line are addressed and read in parallel in accordance with "full-row read". When a cell in the bit line coupled to the charge measurement device receives a pulse with switching capability, two scenarios are possible. Either the pulse with switching capability will switch the cell to the opposite direction to where it resides and the result is a relatively large charge release, represented by the lower part of the curve after time $t_3$ in FIG. 5, or alternatively is the result a non-switched cell with only a minor release of charge represented by the upper part of the curve after time $t_3$ in FIG. 5. To determine which of the cases that has occurred, the signal is typically sampled after point $t_3$, for example at $t_4$. In dual read this would represent the first read value, which in FIG. 4 would be stored in one of the sample and hold circuits 421 or 422. It should be noted that the sampled value at point $t_4$ will contain the noise contributed at $t_1$.

The inventors have found that in some cases, the delimiting factor in a readout value is the unpredictable sampling and sense amplifier offset noise mentioned in the introduction of the application and resulting signal variation occurring at $t_3$ in FIG. 5, as described above. Sampling noise is generated when the sense amplifier goes from the pre-charge to the integration mode at $t_1$ in FIG. 5. This sampling noise is thermal noise generated by the sense amplifier itself and the reset switch and is sampled by the bit line capacitance to yield the noise output shown at $t_2$ in FIG. 5. Here the sense amplifier transfers to the integration mode, and at $t_3$ the switching field is applied to the memory cell. A charge flowing in the bit line joining the memory cell and the sense amplifier is detected and integrated by the sense amplifier. The integrated output signal is then latched to for instance a data line at $t_4$ in FIG. 5. Also when no switching voltage is applied to the memory cell, so-called offset noise is generated in sense amplifier and shows up as a varying noise voltage at the output. The sampling noise, which also is termed the kT/C noise, and offset both degrade the signal-to-noise ratio of the sensing and integrating circuitry, and this in its turn may increase the bit error rate (BER) of the memory device. The unpredictable noise thus limits the signal-to-noise ratio, thereby complicating determination of which logic value that is represented by a readout value. In these cases the inventors have found that the signal-to-noise ratio may be improved by utilizing a "dual sample" method instead of the known dual read approach. In dual sample a first sample is taken after the charge measurements starts, e.g. after start of integration, but before application of a read pulse with switching capability. A second sample is taken after application of a read voltage with switching capability. Referring back to FIG. 5 this means that the first sample is taken at $t_2$, between point $t_1$ and $t_3$, and a second sample is taken at $t_4$ (at the point of the first sample in dual read). In dual sample, the contribution of the unpredictable offset is sampled at $t_2$, which later is deducted from the sample taken at $t_3$, thus leading to a readout value with reduced noise. The dual sample method preferably is used when sneak current contributions are not dominating, however, the method can be combined with dual read in a "dual read, dual sample" approach where dual sample is applied to each of the reads in dual read, i.e. dual sample reduces offset and thermal noise, while dual read mainly reduces noise contributions from sneak currents.

Figure 6:
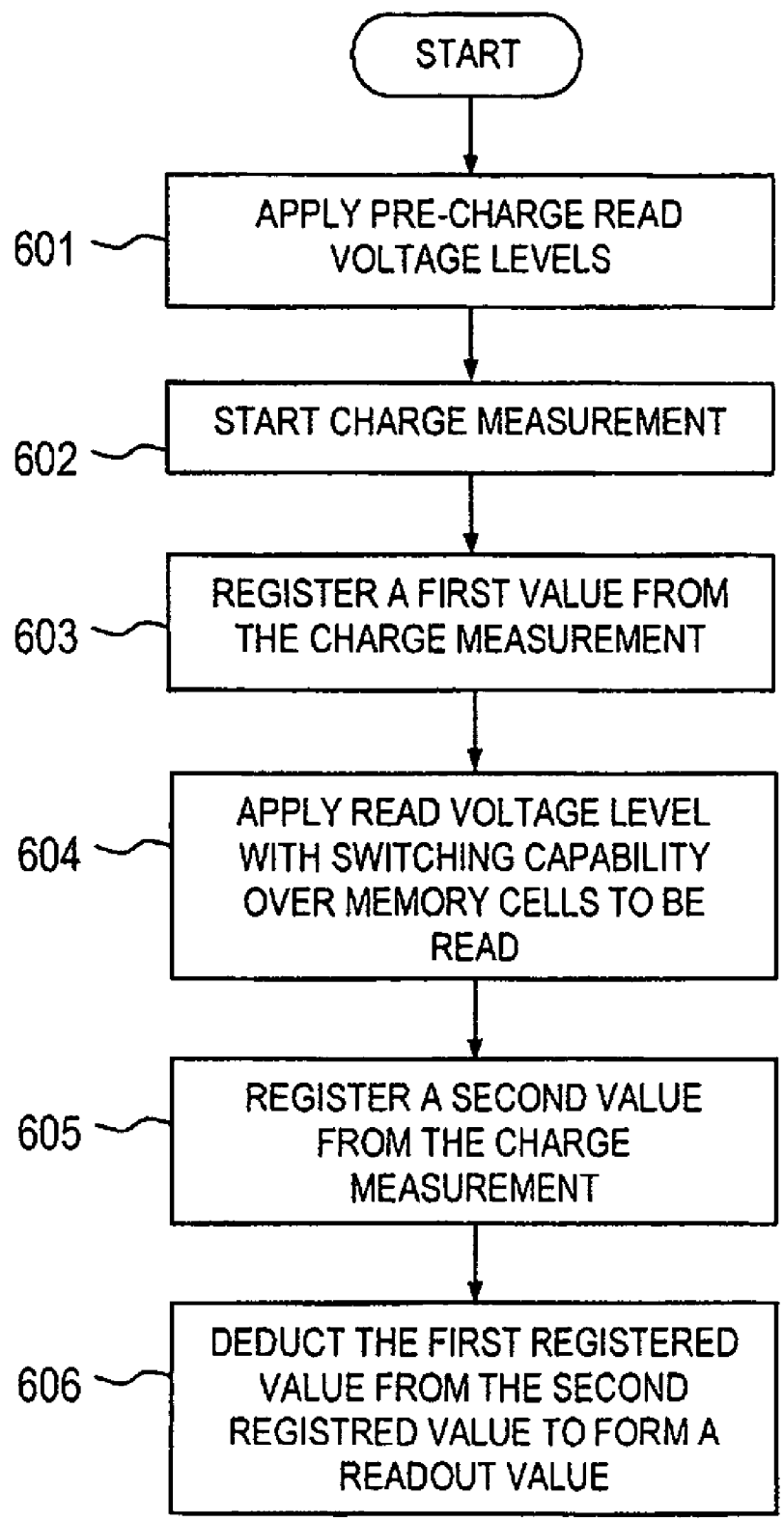

FIG. 6 shows a preferred embodiment of a dual sample method for use in a sensing device according to the invention. In a first step 601, pre-charge read level voltages are applied to the passive matrix of memory cells and no cell receives a voltage with switching capability. After this, charge measurement is started in 602, followed by a step 603 where registration of a first value from the charge measurement is performed, i.e. a first sample is taken. In a following step 604, the voltage levels are shifted such that a read voltage with switching capability is applied over the cell to be read. Next, in step 605, a second value is registered from the charge measurement, i.e. a second sample is taken. A readout value is then formed in step 606 by deducting the first registered value from the second registered value. The result is of course a readout value with improved signal to noise ratio.

It should be noted that the sensing device that is the amplifier stage A1, shown in FIG. 4 also may be used for implementing the dual sample method. However, directly sampling the output from a single stage, high bandwidth and high gain amplifier, as for example amplifier 415 in FIG. 4, may give rise to high levels of noise in the readout signal despite the dual sample approach. The present invention teaches a much better way of implementing the dual sample method by introducing a secondary amplifier stage (A2) after the first amplifier stage (A1). The amplifier in the secondary stage is matched with the amplifier in the first stage, but has lower bandwidth and lower gain. Typically, if the first stage has a gain in the regime of 1000, the secondary stage typically will have a gain in the regime of 10.

Figure 7:
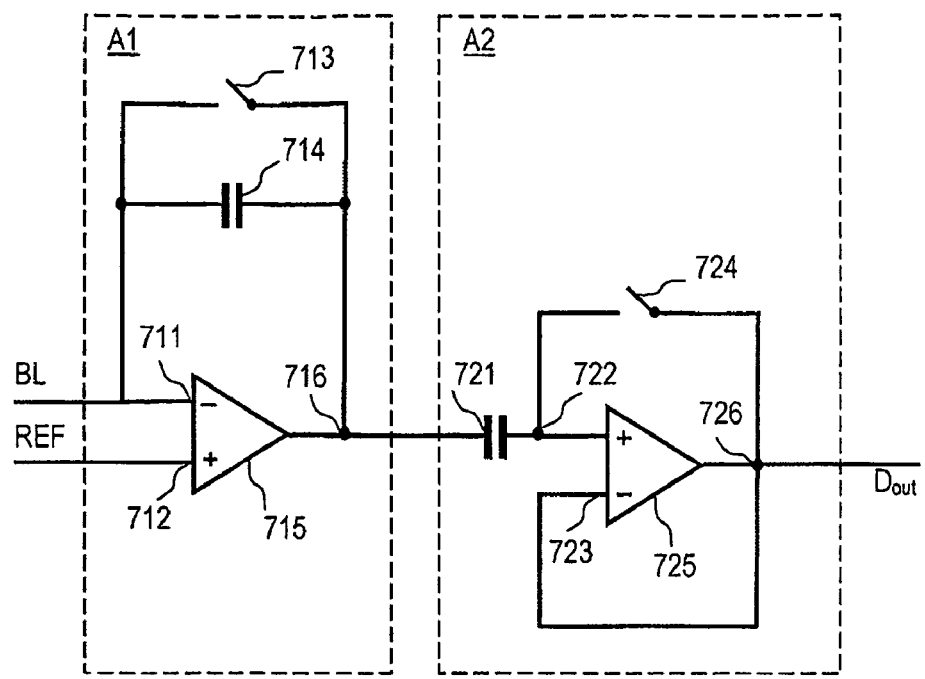

FIG. 7 shows in the form of a circuit diagram a preferred embodiment of a read device for implementing dual sample. The first amplifier stage A1 consists of an amplifier 715, preferably a sense amplifier, with a feedback capacitor 714 between the inverting input 711 and the output 716. The feedback capacitor 714 has a switch 713 in parallel used for switching the amplifier between integrator mode and voltage follower mode. A bit line BL is connected to the inverting input 714 of the amplifier, and a predetermined reference voltage REF is applied to the non-inverting input 713. The output 716 of the first stage couples to the second amplifier stage A2. The input of the second amplifier is connected to a sampling capacitor 721 which is positioned in series with the non-inverting input 722 of the amplifier 725. The amplifier 725 has smaller gain and bandwidth in relation to the first stage amplifier 715, in addition the two amplifier stages A1 and A2 are preferably matched in design according to what is known in the art in order to keep noise at low levels. The inverting input 723 of the second stage amplifier 725 is connected to the output 726 of the amplifier 725. The non-inverted input 722 of the second stage amplifier is connected to the output 726 via a switch 724. When the switch 724 is closed in connects the non-inverting input 722 with the output 725 and a data output signal $D_{out}$ representing the readout value is formed.

The unpredictable noise offset as previously accounted for is sampled by the sampling capacitor 721 by keeping the second stage switch 724 closed until after switch 713 of the first amplifier stage is opened to start integration. After this the unpredictable offset can be cancelled out by closing the second stage switch 724, which nulls the unpredictable noise offset on output 726 of the second stage amplifier, i.e. on the output of the second stage A2. When voltage levels later are shifted such that a read voltage with switching capability is applied over the cell to be read, the output value $D_{out}$ that is formed will be mitigated from noise according to the dual sample method.

The present invention is of particular interest to apply when so called pseudo differential amplifiers known from prior art are used. In a pseudo differential approach, an average value from reference cells representing logic 0 and logic 1 is formed and constitutes an adapted reference threshold level that is directly compared to a readout signal. The comparison results in a positive or negative value which is amplified and presented typically using amplifiers with differential outputs.

Figure 8:
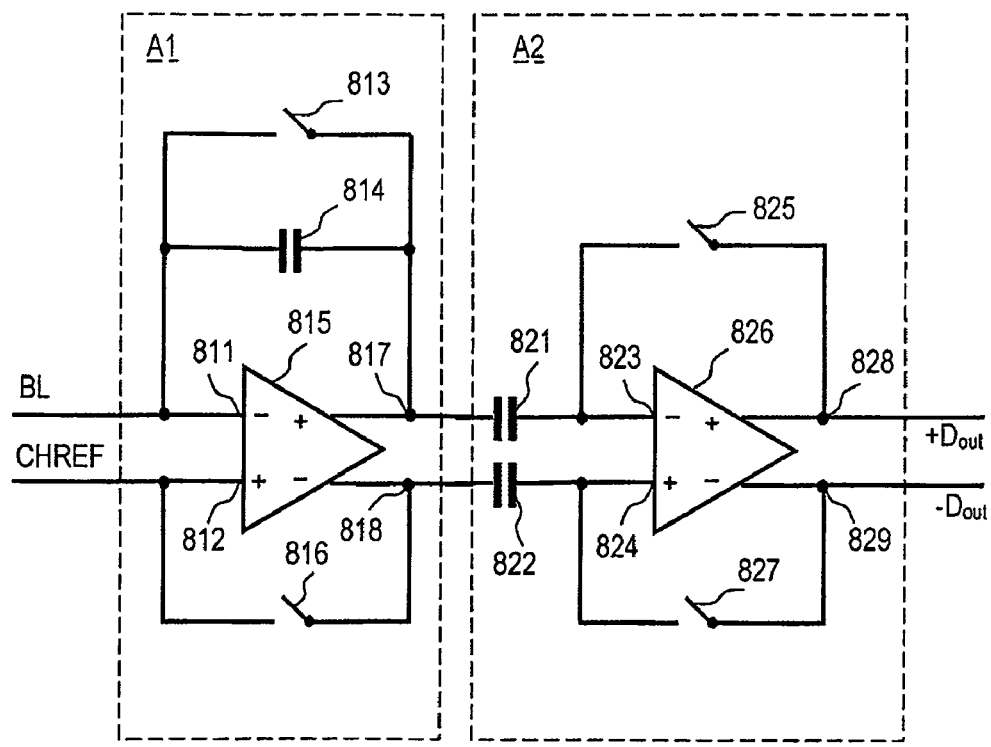

FIG. 8 shows another circuit diagram of a preferred embodiment of a read device according to the invention, here specifically adopted for use with pseudo differential operational amplifiers as known from prior art. The first amplifier stage A1 consists of an amplifier 815 with differential inputs and outputs. A feedback capacitor 814 is connected between an inverting input 811 and a non-inverting output 817. The feedback capacitor 814 has a switch 813 in parallel used for switching the amplifier 815 between integrator mode and voltage follower mode. Due to the differential approach, there is also a similar switch 816 connected between a non-inverting input 812 and a inverting output 818. The switch 816 is typically controlled and operated in parallel with the switch 813. A bit line BL is connected to the inverting input 811 of the amplifier and a charge reference signal CHREF is applied to the non-inverting input 812. The charge reference signal preferably constitutes an average value of a signal representing a logic 0 and logic 1. In accordance with prior disclosures of pseudo differential amplifiers for use in memories of the present type, the CHREF signal is typically originating from reference bit lines and generated by reference amplifiers connected to these reference bit lines. The non-inverting output 817 and the inverting output 818 the first amplifier stage A1 connects to sampling capacitors 821 and 822, respectively. The sampling capacitor 821 further connects to the inverting input 823 of a differential amplifier 826 and the capacitor 822 connects to the non-inverting input 824 of the differential amplifier 826. The second stage amplifier 826 has a switch 825 connected between the inverting input 823 and the non-inverting output 828 and another switch 827 connected between the non-inverting input 824 and the inverting output 829. The two second stage switches 825;827 are typically controlled and operated simultaneously in parallel. In open state they separate outputs from inputs but in closed state they connect outputs to inputs and produce feedback coupling. Data output signals $+D_{out}$ and $-D_{out}$ is formed on the positive output 828 and negative output 829 respectively. The difference between these values represents the readout value.

The reason for the first stage switches 814;816 and the second stage switches 825;827 is of course the same as for their counterparts 713 and 714 in FIG. 7 and so is their typical use, i.e. the unpredictable noise offset is sampled by the sampling capacitor 821 and 822 by keeping the second stage switches 825;827 closed until after the first amplifier stage switches 813;816 are opened to start integration. After this the unpredictable offset can be cancelled out by closing the second stage switches which nulls the unpredictable noise offset on the outputs 828;829 of the second stage amplifier, i.e. on the output of the second stage A2. When voltage levels later are shifted such that a read voltage with switching capability is applied over the cell to be read, the output values $+D_{out}$ and $-D_{out}$ will be mitigated from noise according to the dual sample principle.

A pseudo-differential approach and use of charge reference will facilitate discrimination of logic 0 and logic 1 in the readout value. One of the logic states will be represented by a negative difference between $+D_{out}$ and $-D_{out}$ and the other logic state will be represented by a positive difference. This will for example enable simple design of latches that follows the read device to provide a stable logic readout value.

Of similar reason as in the first stage there will be some unpredictable noise contributions also from the secondary stage A2, but due to the lower gain and bandwidth of the second stage amplifier and by proper match/design between the two amplifier stages, this noise can be kept at significantly lower levels than the noise from the first stage A1.

Figure 9:
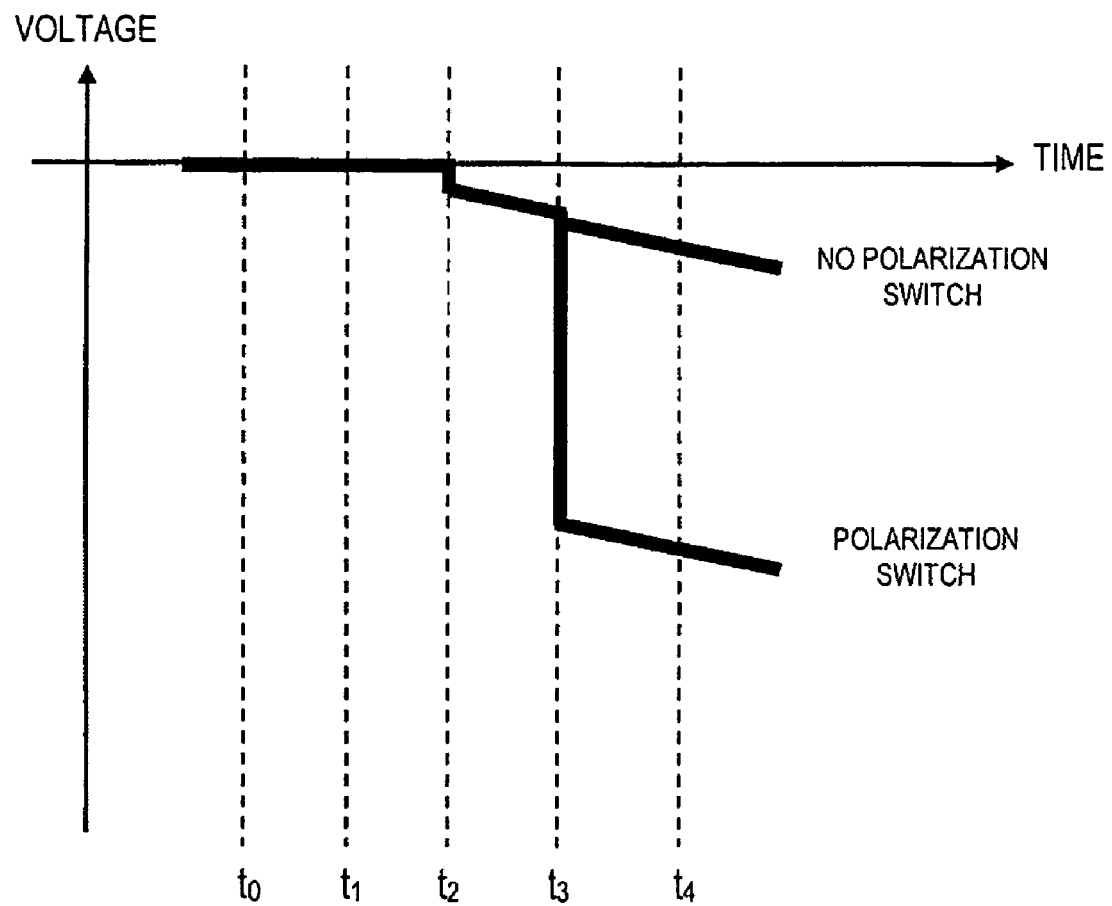

FIG. 9 now show example of signal behaviour in a situation where dual sample is applied, which should be compared to the prior situation by referring back to FIG. 5. The signal in FIG. 9 corresponds to the output of the second amplifier stage, e.g. $D_{out}$ in FIG. 7 or the difference between $+D_{out}$ and $-D_{out}$ in FIG. 8. The signal level has been normalized so that the output starts on zero voltage and then will increase with negative numbers. Before time $t_1$, for example at $t_0$, the voltage levels applied to the electrodes results in pre-charge voltages over the memory cells and there is no cell voltage with switching capability applied. In pre-charge, cell voltages over cells that are not to be read typically are the same as during the later application of read cell voltages. At time $t_1$ the sensing starts. Using the device shown in FIG. 7 this implies that the switch 713 is opened and integration starts while the second stage switch 724 continues to be open. This prevents thermal noise from the switch 713 together with offsets and thermal noise from the amplifier 715 to be visible in the signal and instead the unpredictable noise offset is sampled by sampling capacitor 721. When the capacitor 721 has sampled a desired amount of noise, the second stage switch 724 is closed at time $t_2$. Another unpredictable offset follows from this, as illustrated by a small signal drop at $t_2$, but the magnitude is much smaller compared to the previous situation in FIG. 45 at $t_1$. At time $t_3$ the cell to be read receives a voltage with switching capability and the response is similar to the situation in FIG. 45, i.c. two signal paths are possible depending on if there is a polarization switch or not in the cell being read. However, there is now less noise in the signal output and hence a readout value at time $t_4$ will represent a more reliable measurement of the logic state.

Embodiments and examples have been presented hereinabove in order to provide concreteness to the invention and make it applicable to persons skilled in the art. It is not intended that specific references shall be considered as limitations of the scope of the invention, except from what is set forth in the accompanying claims.

The invention claimed is:

1. A method of reading a memory cell in a passive-matrix addressable ferroelectric or electret memory array with memory cells in the form of electret or ferroelectric capacitors, wherein the memory cells are being located at the crossings of a first and second set of respective parallel electrodes, the first set forming word lines and the second set forming bit lines, wherein the word lines and the bit lines are connected to driving means, wherein the bit lines have connection to sensing means for measuring charge flowing in the bit lines, wherein the sensing means in a read operation senses a current response signal corresponding to the data, typically a binary one or a binary zero, wherein the method comprises:
   a) starting a charge measurement by activating the sensing means connected to the bit line of the memory cell,
   b) registering a first value from the charge measurement, and
   c) applying a voltage with switching capability over the memory cell by driving the electrodes using a predefined set of read voltage levels, and
   d) registering a second value from the charge measurement, deducting the first registered value from the second registered value to form a readout value.

2. The method according to claim 1, comprising an additional step of pre-charging the word lines, the bit lines and the sensing means while driving the electrodes using another predefined set of read voltage levels without switching capability.

3. A method according to claim 1, comprising a further step of comparing the readout value with a reference value for determining the logic state represented by the readout value.

4. A sensing device for reading data stored in a passive matrix memory comprising memory cells in the form of electret or ferroelectric capacitors, wherein the memory cells are being located at the crossings of a first and second set of respective parallel electrodes, the first set forming word lines and the second set forming bit lines, wherein the word lines and the bit lines are connected to driving means, wherein the bit lines have connection to sensing means for measuring charge flowing in the bit lines, wherein the sensing device senses a current response corresponding to the data, typically a binary one or a binary zero, wherein the sensing device comprises a first amplifier stage with an integrator circuit consisting of a first amplifier of a first gain and a first bandwidth, characterized in that the sensing device comprises:
- a second amplifier stage following the first amplifier stage, wherein the second amplifier stage comprises a second amplifier of a second gain and a second bandwidth, and a sampling capacitor connected between an output of the first amplifier stage and an input of the second amplifier.

5. The sensing device according to claim 4, wherein the second gain is significantly lower than the first gain.

6. The sensing device according to claim 4, wherein the second bandwidth is less than the first bandwidth.

7. The sensing device according to claim 4, wherein the first amplifier stage and the second amplifier stage are matched in design.

8. The sensing device according to claim 4, including a switch connected between an output of the second amplifier and the input of the second amplifier that is connected to a sampling capacitor.

9. The sensing device according to claim 4, wherein the first amplifier stage comprises an integrator circuit.

10. The sensing device according to claim 4, wherein a bit line of the passive matrix is connected to an inverting input of the first amplifier and that a reference node with a signal representing an average logic 0 or logic 1 response is connected to a non-inverting input of the first amplifier.

11. The sensing device according to claim 4, wherein the first and the second amplifier have differential inputs and outputs.

12. The sensing device according to claim 4, wherein pseudo-differential amplifiers are used.

* * * * *